(12) United States Patent
Carpenter

(10) Patent No.: US 8,997,769 B2
(45) Date of Patent: Apr. 7, 2015

(54) CANOPY FOR PORTABLE ELECTRICAL DEVICE

(75) Inventor: Mark A. Carpenter, Nottingham, NH (US)

(73) Assignee: GenTent Safety Canopies, LLC, Nottingham, NH (US)

( * ) Notice: Subject to any disclaimer, the term of this patent is extended or adjusted under 35 U.S.C. 154(b) by 154 days.

(21) Appl. No.: 13/593,881

(22) Filed: Aug. 24, 2012

(65) Prior Publication Data

US 2013/0050975 A1 Feb. 28, 2013

Related U.S. Application Data

(60) Provisional application No. 61/528,168, filed on Aug. 27, 2011.

(51) Int. Cl.
*E04H 15/02* (2006.01)
*F02B 63/04* (2006.01)

(52) U.S. Cl.
CPC ......... *F02B 63/048* (2013.01); *Y10T 29/49002* (2015.01); *E04H 15/02* (2013.01); *F02B 63/04* (2013.01); *Y10S 135/905* (2013.01)

(58) Field of Classification Search
CPC ......... E04H 15/02; E04H 15/34; E04H 15/36; E04H 15/58; B65D 65/02; B65D 37/00; B65D 2585/86; F02B 63/04; F02B 63/044; F02B 2063/045; H02K 5/136; H02K 5/24
USPC .......... 135/93, 96, 124, 135, 117, 119, 120.1, 135/120.3, 161, 905; 150/154, 157, 158, 150/165; 361/810, 816, 824; 290/1 A; 29/592.1

See application file for complete search history.

(56) References Cited

U.S. PATENT DOCUMENTS

| | | | | | |
|---|---|---|---|---|---|
| 2,917,094 | A | * | 12/1959 | Sullivan | 150/166 |
| 3,233,618 | A | * | 2/1966 | Ferrier | 108/42 |
| 3,525,290 | A | * | 8/1970 | Pelsue | 135/126 |
| 4,086,931 | A | * | 5/1978 | Hall | 135/98 |
| 4,285,354 | A | * | 8/1981 | Beavers | 135/135 |
| 6,376,951 | B1 | * | 4/2002 | Moore | 310/89 |
| 6,516,823 | B1 | * | 2/2003 | Glover et al. | 135/94 |
| 7,152,733 | B2 | * | 12/2006 | Trickett | 206/320 |
| 7,819,151 | B1 | * | 10/2010 | Kuhn | 150/154 |
| 8,069,871 | B2 | * | 12/2011 | Schneider | 135/96 |
| 8,667,949 | B2 | * | 3/2014 | Mizuguchi | 123/198 E |
| 2008/0042625 | A1 | * | 2/2008 | Konop et al. | 322/1 |
| 2010/0013177 | A1 | * | 1/2010 | Horn, Jr. | 280/47.24 |

(Continued)

OTHER PUBLICATIONS

NoOutage.com LLC, "Genshed GS7500", Oct. 9, 2012, [online] [retrieved on Nov. 28, 2012] Retrieved from internet <URL: http://www.nooutage.com/genshed.htm>, 3 pages.

Supergen Products, "Supergen Tent Reduce Generator Noise", [online] [retrieved on Nov. 28, 2012] Retrieved from internet <URL: http://supergenproducts.com/gentent.html>, 3 pages.

(Continued)

*Primary Examiner* — Winnie Yip
(74) *Attorney, Agent, or Firm* — Maine Cernota & Rardin

(57) ABSTRACT

A system and method are provided for the shielding of outdoor electrical equipment from inclement weather, the system comprising: a plurality of support brackets affixed to the outdoor electrical equipment; a support frame disposed in the support brackets; a waterproof cover disposed over the frame; an apron depending from the cover, configured to cover electrical connections on a side of the outdoor electrical equipment.

2 Claims, 10 Drawing Sheets

(56) References Cited

U.S. PATENT DOCUMENTS

2010/0275962 A1* 11/2010 Park et al. .................... 135/122
2013/0074421 A1* 3/2013 Wood et al. ...................... 52/3

OTHER PUBLICATIONS

GenDry, "GenDry", [online] [retrieved on Nov. 28, 2012] Retrieved from internet <URL: http://www.gen-dry.com/>, 1 page.

* cited by examiner

CANOPY FOR PORTABLE ELECTRICAL DEVICE

CROSS-REFERENCE TO RELATED APPLICATIONS

This application claims benefit of U.S. Provisional Application No. 61/528,168 filed on Aug. 27, 2011. That application is herein incorporated by reference in its entirety for all purposes.

FIELD OF THE INVENTION

The present invention is in the technical field of canopies. More particularly, the present invention is in the technical field of enclosures or covers for portable electrical devices which can be used while the portable electrical device is operating.

BACKGROUND OF THE INVENTION

Portable electrical generators are specifically to be used outdoor, with warning labels and instructions that warn against use too close to a dwelling, in garages, or other protected areas where poisonous gasses can accumulate and enter an occupied dwelling. Further, portable electrical generator manufacturers warn against operating a portable electrical generator in an enclosed shed or other small enclosure because these kinds of environments restrict air flow around and through the unit and pose an overheating hazard. Finally, portable electrical generators cannot be exposed to rain, sleet, snow or ice, since wet conditions pose a risk of shock and electrocution. Many times it is during times of precipitation that a portable electrical generator is needed, and regardless of manufacturer warnings, portable electrical generator users take the risk to operate them in garages, on or under porches and in other covered or enclosed areas that can allow deadly gasses to infiltrate a dwelling or cause overheating. Portable electrical generator accidents often occur during times of bad weather, when the generator is most needed.

Some manufacturers, in addition to the Consumer Product Safety Commission, suggest that a generator can be safely used outdoors in inclement weather when under a portable pop-up canopy. In practice, this is a fundamentally unsound approach. Portable pop-up canopies are difficult to anchor, especially in frozen conditions or on driveways, they provide no protection to precipitation that is blown in from an angular direction, they cannot withstand moderate winds without collapsing or being blown away, and they are susceptible to collapse under the weight of moderate snow and ice.

SUMMARY OF THE INVENTION

One embodiment of the present invention provides a system for the shielding of outdoor electrical equipment from inclement weather, the system comprising: a plurality of support brackets affixed to the outdoor electrical equipment; a support frame disposed in the support brackets; a waterproof cover disposed over the frame; an apron depending from the cover, configured to cover electrical connections on a side of the outdoor electrical equipment.

Another embodiment of the present invention provides such a system further comprising a covered vent disposed at an apex of the waterproof cover.

A further embodiment of the present invention provides such a system wherein the apron depends from hook and loop fasteners disposed beneath an edge of the waterproof cover.

Yet another embodiment of the present invention provides such a system wherein the apron exposes cooling surfaces of the outdoor electrical equipment.

A yet further embodiment of the present invention provides such a system wherein the waterproof cover further comprises a closable aperture through which a user may supply liquid fuel to the outdoor electrical equipment.

Even another embodiment of the present invention provides such a system wherein the waterproof cover further comprises at least one aperture.

One embodiment of the present invention provides a method for the deflection of water from portable electrical equipment, the method comprising: affixing a plurality of mounting brackets to a frame of the portable electrical equipment; inserting support rods into the brackets so as to create a support frame; extending a waterproof cover over the support frame while allowing ventilation of the portable electrical equipment.

Another embodiment of the present invention provides such a method wherein the portable electrical equipment comprises a portable electrical generator.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1:
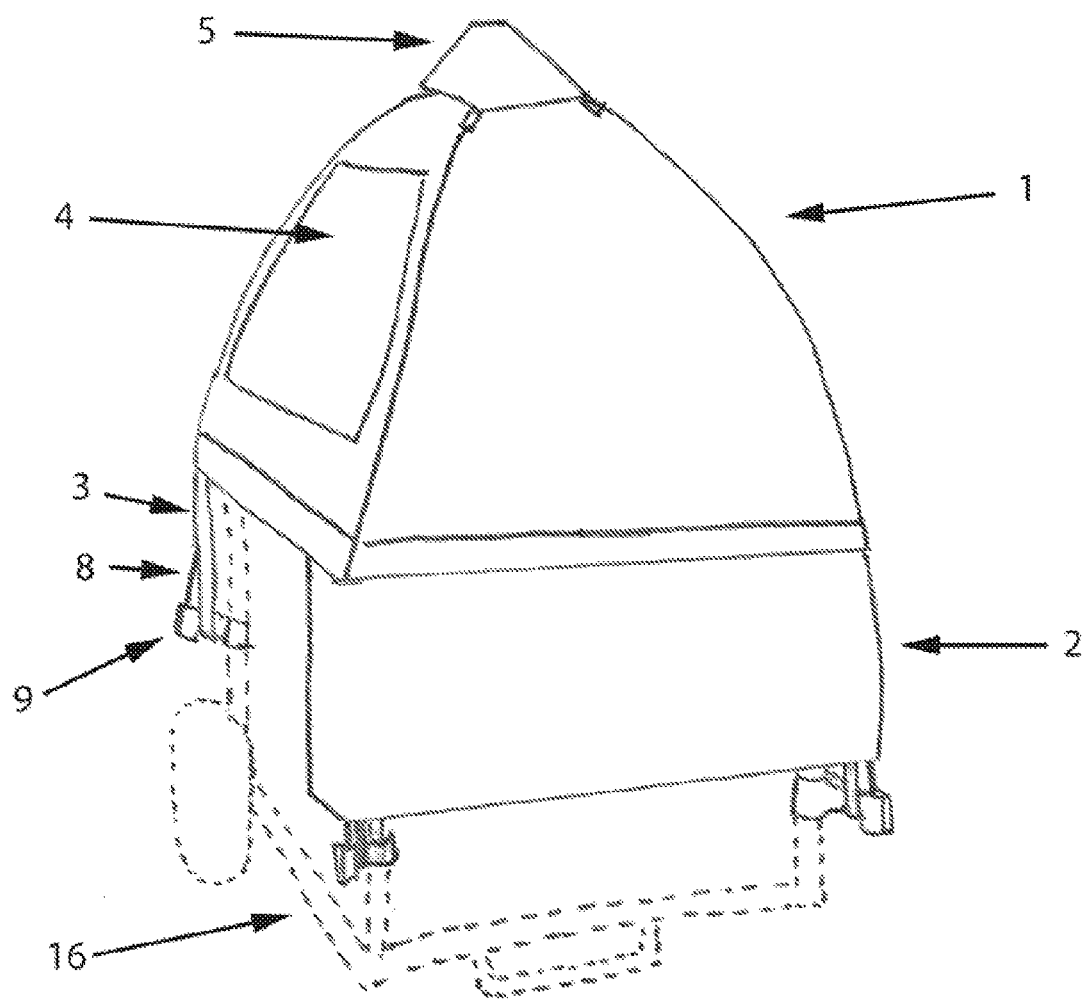
FIG. 1 is a perspective view of a portable electrical generator safety canopy of one embodiment of the present invention.
Figure 3:
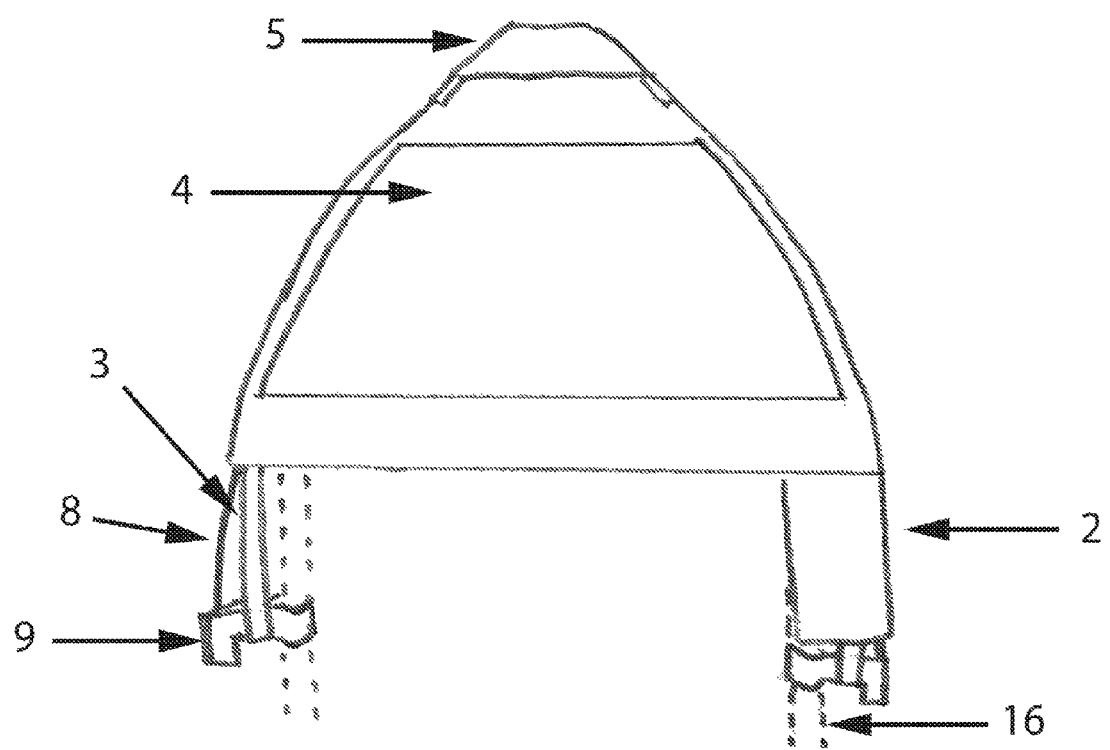
FIG. 3 is a side view of a portable electrical generator safety canopy of FIG. 1.

Referring now to one embodiment of the invention in more detail, in FIG. 1 and FIG. 3 there is shown a portable electrical generator safety canopy consisting of a main cover 1 which allows attachment of the electrical cover 2 and comprises an access door 4 and a vapor release cover 5. The main cover 1 is shown secured to a frame rod 8 by a strap 3. The frame rod 8 is secured to the portable electrical generator frame 16 by a tube connecting telescoping clamp 9. One skilled in the art will appreciate that other outdoor portable electrical or internal combustion engine equipment may employ a canopy or cover configured in accord with the various embodiments of the present invention. Such outdoor equipment may include but is not limited to pumps, spotlights, air compressor, power washers, and heat pumps.

Figure 2:
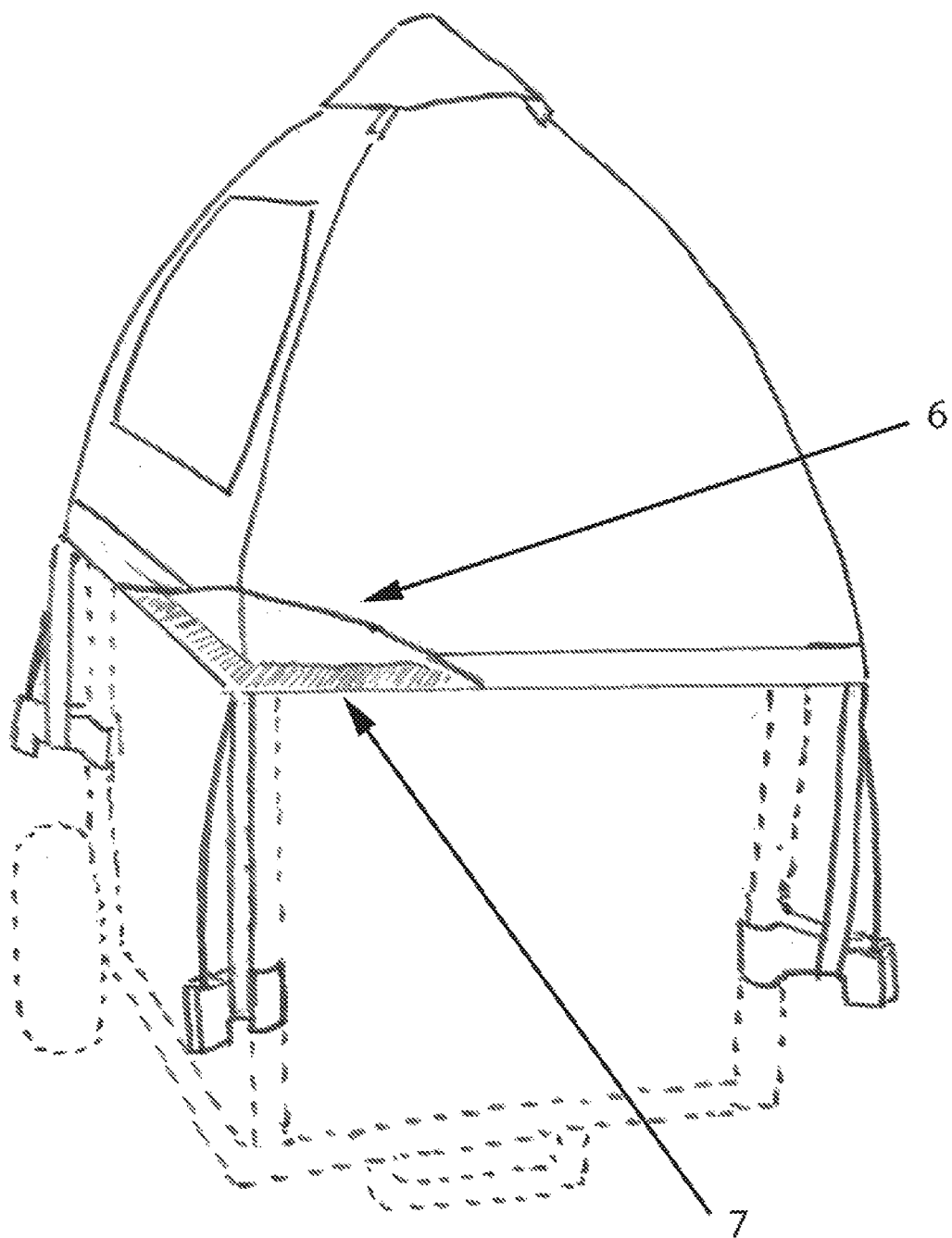
FIG. 2 is a perspective view of a portable electrical generator safety canopy of one embodiment of the present invention.

In further detail, referring to FIG. 1 and FIG. 3 there depicts an attachment of electrical cover 2 to the main cover 1 via a fastener section 7 that traverses the entire bottom edge of main cover 1 and employs a waterproofing cover flap 6. The cover flap 6 is lifted up in FIG. 2, which exposes the fastener section 7, which secures the electrical cover 2. The electrical cover 2 is an apron which hangs from the fastener section 7 along the bottom edge of the main cover 1 and continues around the corners of the generators to cover the electrical connections on one side and portions of the generator on the sides adjacent to the side with the electrical connections, as illustrated in FIG. 3, without a split or opening in the electrical cover 2 at the two covered corners. The cover flap 6 is then dropped back over electrical cover 2 forming a waterproof covering.

Figure 4:
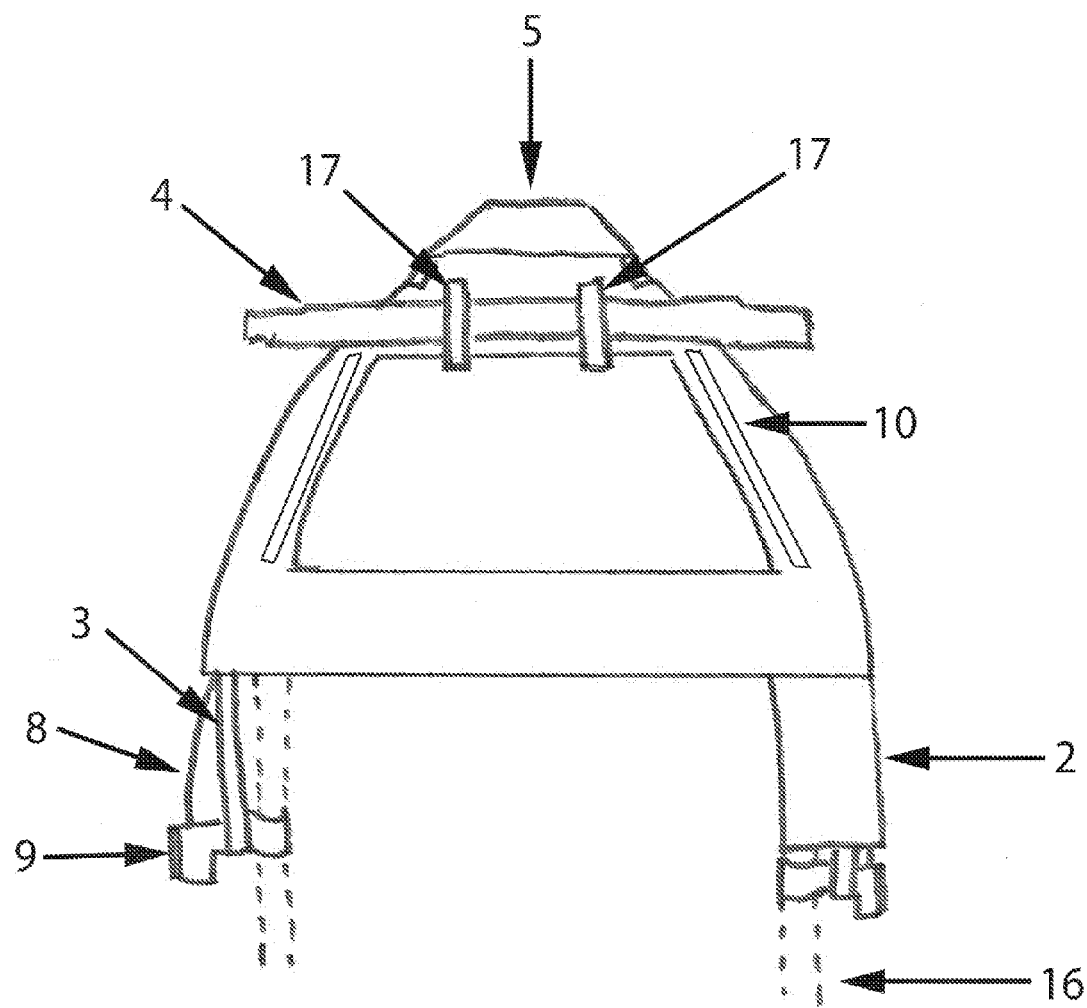
FIG. 4 is a side view of a portable electrical generator safety canopy of FIG. 1.

Referring now to FIG. 4, there is shown an open access door 4 which is secured into open position by securing door straps 17 to main cover 1. Further, when returned to closed position, access door 4 is secured to main cover 1 by fastener 10.

Figure 5:
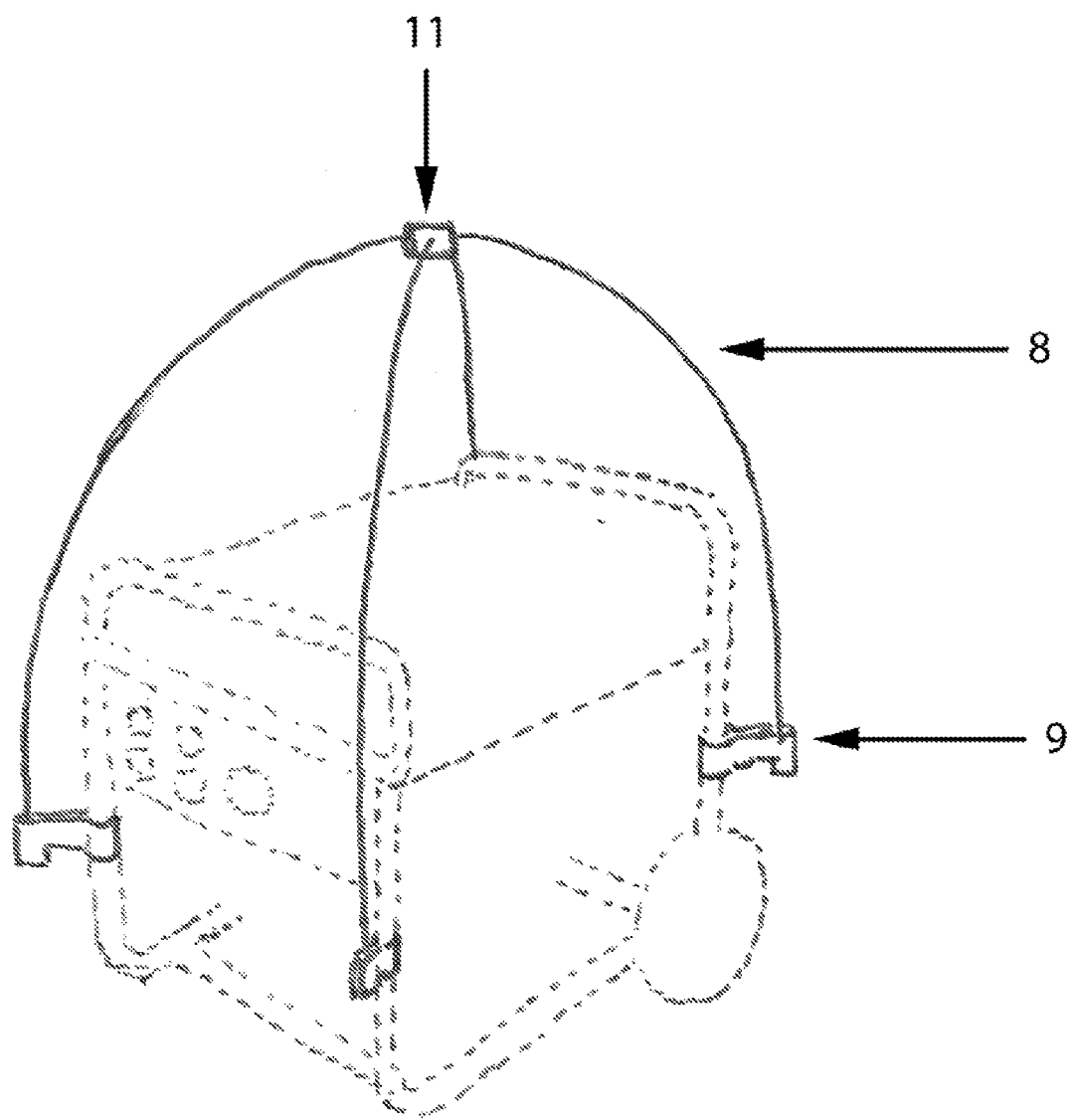
FIG. 5 is a perspective view of a portable electrical generator safety canopy supporting frame of one embodiment of the present invention.

Referring now to FIG. 5, there is shown a portable electrical generator safety canopy frame consisting of multiple frame rod sections 8 which are secured at the top central location by frame connector 11. Further, each frame rod section 8 connects into a tube connecting telescoping clamp 9.

Figure 6:
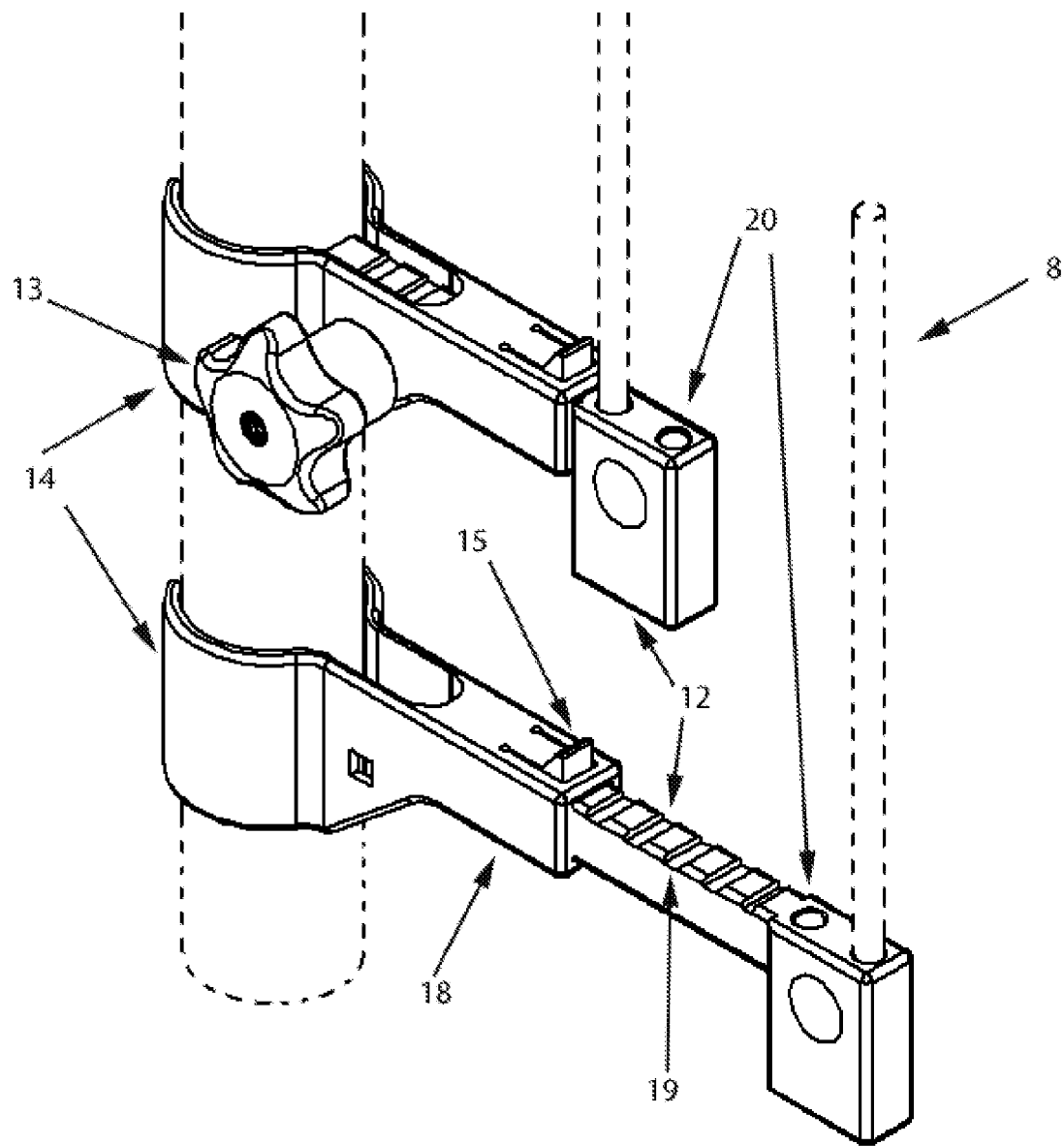
FIG. 6 is a perspective view of a portable electrical generator safety canopy frame adjusting clamp of one embodiment of the present invention.
Figure 7:
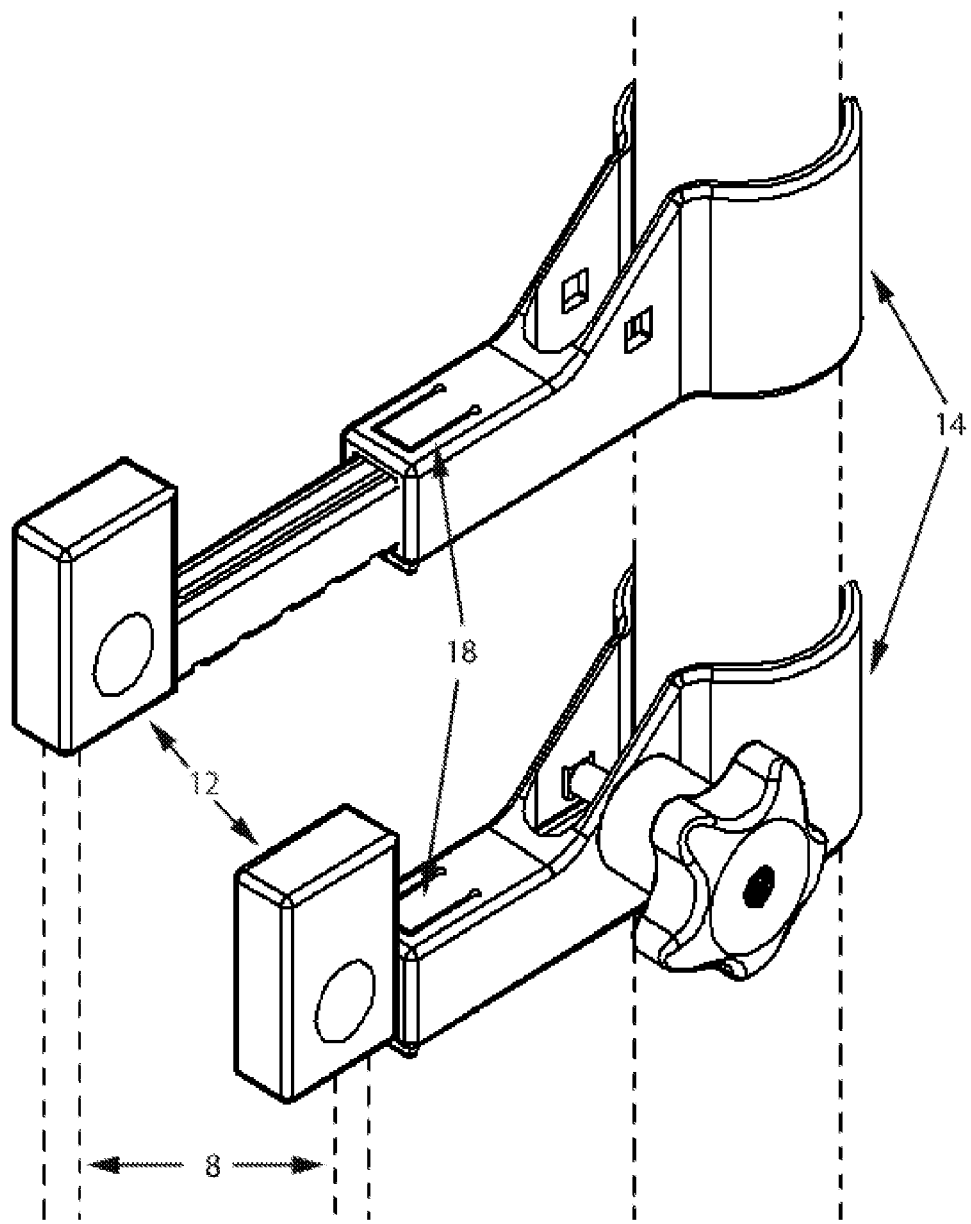
FIG. 7 is a perspective view of a portable electrical generator safety canopy frame adjusting clamp bottom section of one embodiment of the present invention.

Referring now to FIG. 6 and FIG. 7, there is shown a tube connecting telescoping clamp consisting of a main clamp section 14 that is secured to a tube with thumb screw 13 and telescoping section 12. Now in more detail, main clamp section 14 employs a thumb latch 15 which sets stop points for telescoping section 12 at predetermined interval locations. Further, main clamp section 14 employs a bottom latch 18 that allows insertion of telescoping section 12 and, once inserted, restricts telescoping section 12 from being removed. Now in more detail, telescoping section 12 employs notches 19 at predetermined interval locations which are formed in such a way that pushing the telescoping section 12 into main clamp section 14 does not require engaging the thumb latch 15. Further, the notches 19 are formed in such a way that the thumb latch 15 on main clamp section 14 must be engaged in order to allow outward adjustment of the telescoping section 12. Further, the telescoping section 12 provides holes 20, each of which holds one frame rod section 8.

Figure 8:
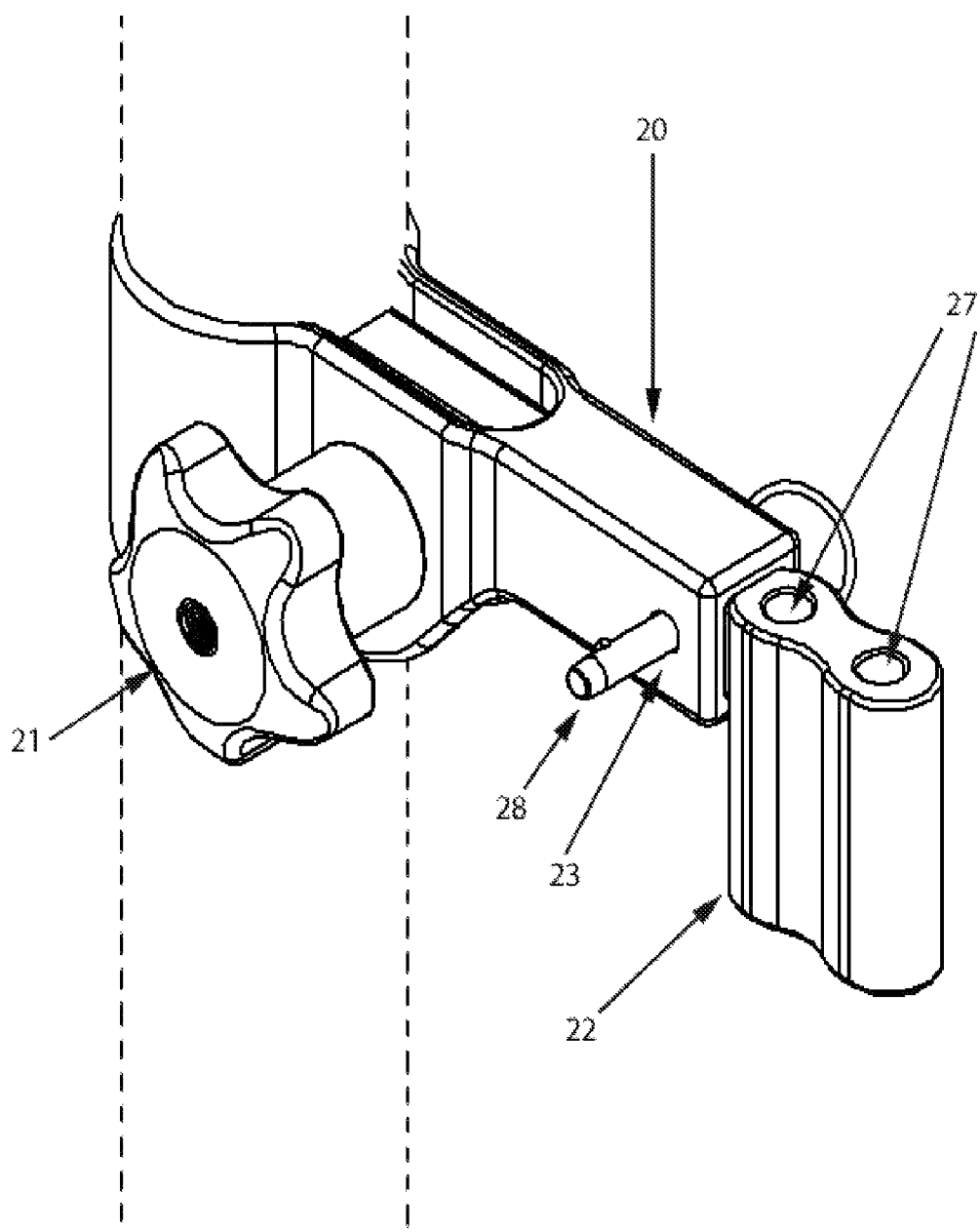
FIG. 8 is a perspective view of an alternate portable electrical generator safety canopy frame adjusting clamp of one embodiment of the present invention.
Figure 9:
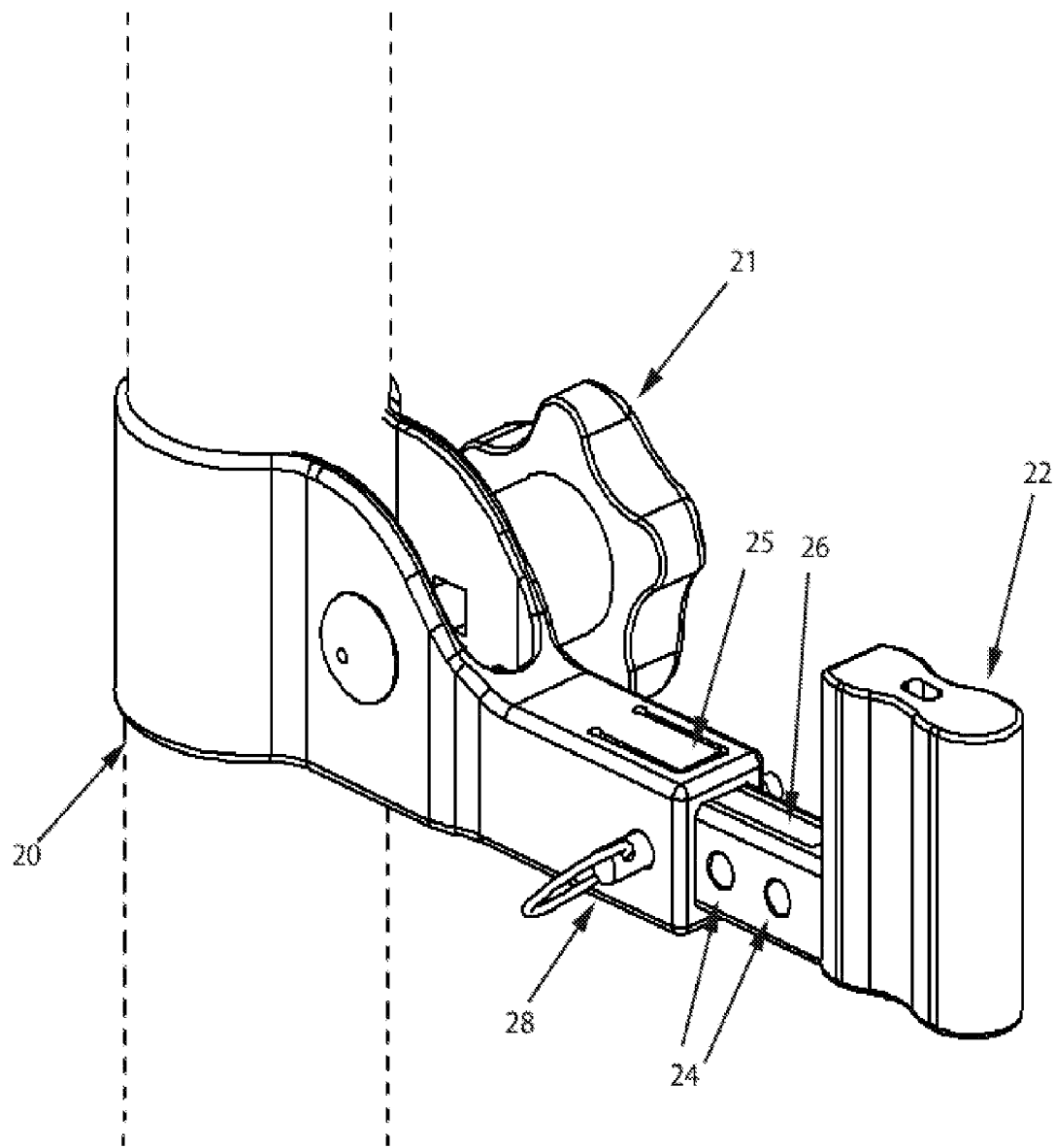
FIG. 9 is a perspective view of an alternate portable electrical generator safety canopy frame adjusting clamp bottom section of one embodiment of the present invention.

Referring now to FIG. 8 and FIG. 9, there is shown an alternative telescoping clamp system consisting of a main clamp section 20 that is secured to a tube with thumb screw 21 and telescoping section 22. Now in more detail, main clamp section 20 employs a ring detent pin hole 23 and telescoping section 22 employs several ring detent pin holes 24 at predetermined interval locations. Further, the clamp system is adjusted to length by aligning a predetermined interval location ring detent pin hole in the telescoping section 22 with the ring detent pin hole 23 in the main clamp section 20 and inserting a ring detent pin 28. Further, main clamp section 20 employs a bottom stop 25. Telescoping section 22 employs a bottom groove 26, and once inserted over the clamp section bottom stop 25, removal is restricted during any upward or parallel forces. Further, the telescoping section 22 provides holes 27, each of which holds one frame rod section 8.

Figure 10:
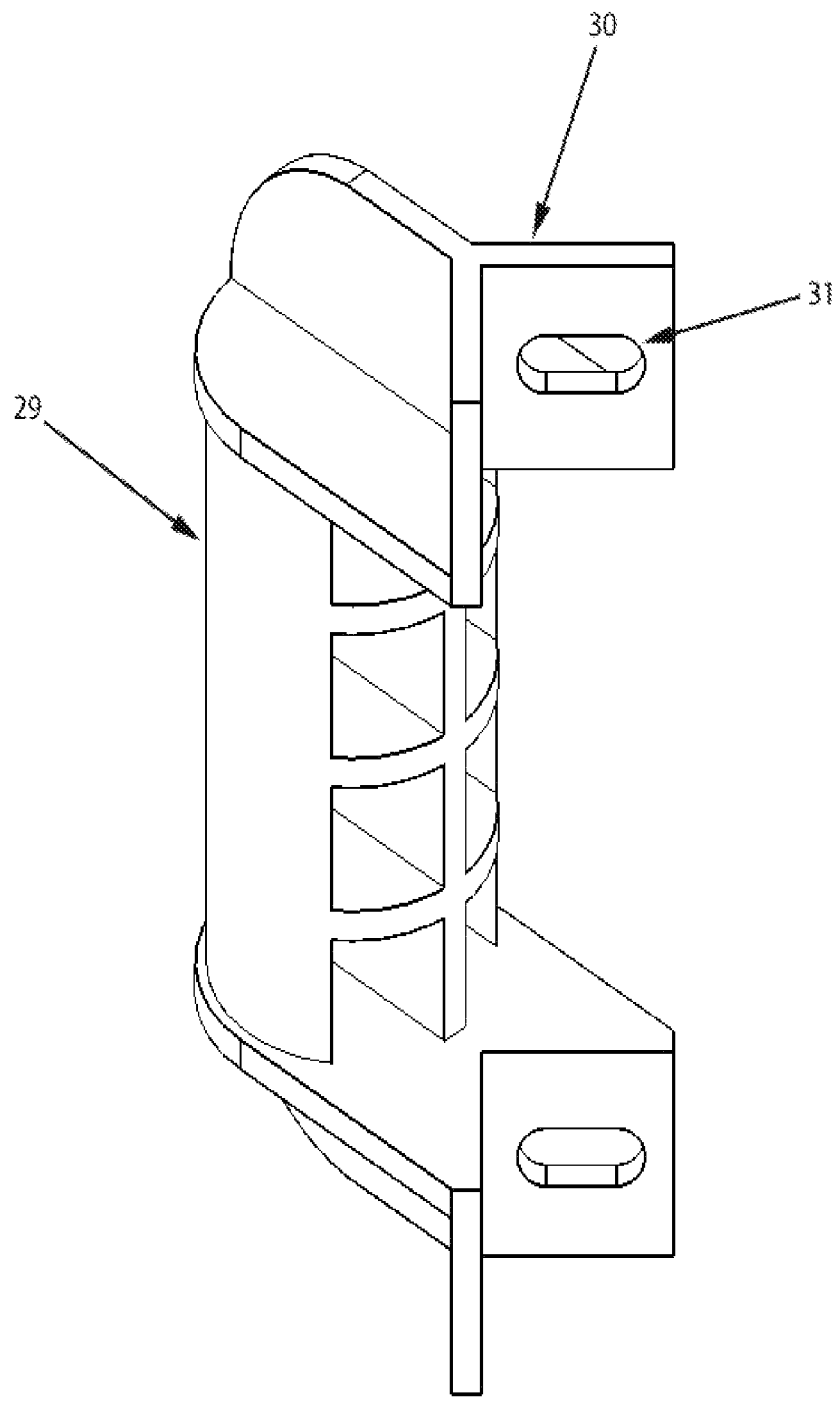
FIG. 10 is a perspective view of a portable electrical generator safety canopy frame adapter of one embodiment of the present invention.

Referring now to FIG. 10, there is shown a frame adapter consisting of a tubular section 29 combined with a corner section 30. Further, the corner section 30 employs slotted holes 31 which accommodate attachment to a multitude of square tube frames and round tube frames. Now in more detail, the frame adapter provides a method to attach main clamp section 14 or main clamp section 20 in the event the portable electrical generator frame 16 cannot provide a mounting point for main clamp section 14 or main clamp section 20 because of square or rectangular frame shapes, or other portable electrical generator parts which may already be connected to frame 16. Further, the frame adapter provides a method to increase, or extend, the effective length and width of the portable electrical generator frame 16, as may be necessary for very small portable electrical generator frames. The frame adapter may be attached to the frame 16 through a multitude of methods including screws, bolts and nuts, welding and strapping.

In further detail, still referring to the invention of FIG. 1, the main cover 1 is sufficiently wide at the bottom edges to cover portable electrical generator frames of the typical length up to 32 inches and typical width up to 22 inches. The tube connecting telescoping clamp allows sufficient adjustments to ensure a consistent portable electrical generator safety canopy frame size of approximately 24 inches wide and 35 inches in length. The portable electrical generator safety canopy frame is sufficiently sloped, from the center to each corner to assure water shedding action away from the underlying portable electrical generator.

In further detail, still referring to the invention of FIG. 1, the main cover 1 can be increased or decreased in size to cover an effectively unlimited range of portable electrical generator frame sizes. By simply changing the length of the frame rods 8 and increasing the width and length of the main cover 1 at the bottom edges while keeping a consistent relative size for all other dimensions of main cover 1, different portable electrical generator frame sizes are accommodated.

The construction details of the invention as shown in FIG. 1 through FIG. 10 are that the portable electrical generator safety canopy main cover 1 can be made of any material sufficiently waterproof and strong such as various fabrics, high strength plastic, molded fiberglass, metal and the like. Further the various components 2, 4 and 5 can be made of similar materials, while the fastener sections 7 and 10 can be made using hook and loop, zipper or other methods that exhibit satisfactory waterproofing and secure closure characteristics. The portable electrical generator safety canopy frame, as depicted in FIG. 5 can be made of materials sufficiently strong and tensile to form the appropriate frame arc in order to allow shedding of water while maintaining strength enough to hold water, snow, and ice without breaking. The materials can be aluminum, steel, carbon fiber, wood and fiberglass formed into rods and tubes of either round, square or rectangular cross section shapes. The frame connector 11 can also be made of similar materials. The tube connecting telescoping clamp 12, 14, 20 and 22 and the frame adapter (FIG. 10) can be made of materials sufficiently rigid and strong enough to not crack or fatigue and to hold the portable electrical generator safety canopy frame securely. The materials include wood, aluminum, steel and high strength plastics and the like.

The advantages of the present invention include, without limitation, that it is sufficiently waterproof and sheds precipitation, in any form, away from electrical sockets on portable electrical generators that could cause an electrocution hazard or disruption of power if they were to get wet. Further, the invention maintains, without disruption, sufficient normal airflow around the portable electrical generator that it will not overheat. Further, the invention is sufficiently strong to withstand storm winds with gusts up to Beaufort scale 10 and accumulations of snow and ice. Further, the invention accommodates a wide range of portable electrical generators. Further, the invention allows convenient access to refueling, starting, stopping and connecting electrical wires to portable electrical generators. Further, this invention does not require modification of portable electrical generators. Further the invention is easily installed, removed and portable.

In broad embodiment, the present invention is a waterproof, water shedding enclosure that surrounds the top and electrical connection sockets of portable electrical generators.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for the deflection of water from a portable electrical generator, said method comprising:
    affixing a plurality of mounting brackets to a vertical frame of said portable electrical generator;
    adjusting said brackets to correspond to the footprint of said generator and a desired height;
    inserting support rods into said brackets so as to create a support frame;
    extending a waterproof cover over said support frame while allowing ventilation of said portable electrical generator and an apron hanging from a bottom edge of said waterproof cover to cover electrical connections of said generator and at least two corners of said generator adjacent to said electrical connections.

2. The method of claim 1 wherein said mounting brackets are adjustable and adapted for installation on generators of various sizes.

* * * * *